the page

United States Patent
Teng et al.

(10) Patent No.: US 8,421,474 B2
(45) Date of Patent: Apr. 16, 2013

(54) CIRCUIT TEST APPARATUS

(75) Inventors: Cheng-Yung Teng, Taipei County (TW); Li-Ying Chang, Taipei County (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 897 days.

(21) Appl. No.: 12/244,319

(22) Filed: Oct. 2, 2008

(65) Prior Publication Data

US 2009/0302861 A1 Dec. 10, 2009

(30) Foreign Application Priority Data

Jun. 10, 2008 (TW) .............................. 97210244 U

(51) Int. Cl.
*G01R 31/02* (2006.01)

(52) U.S. Cl.
USPC ...................... 324/537; 324/527; 324/750.01

(58) Field of Classification Search ................... 324/537
See application file for complete search history.

(56) References Cited

U.S. PATENT DOCUMENTS

| | | | | |
|---|---|---|---|---|
| 4,517,512 A | * | 5/1985 | Petrich et al. | 714/724 |
| 4,635,259 A | * | 1/1987 | Schinabeck et al. | 714/734 |
| 4,686,628 A | * | 8/1987 | Lee et al. | 702/117 |
| 5,101,153 A | * | 3/1992 | Morong, III | 324/537 |
| 6,275,962 B1 | * | 8/2001 | Fuller et al. | 714/724 |
| 6,804,620 B1 | * | 10/2004 | Larson et al. | 702/91 |
| 7,492,170 B2 | * | 2/2009 | Crook et al. | 324/690 |
| 2009/0326844 A1 | * | 12/2009 | Teng et al. | 702/65 |

OTHER PUBLICATIONS

Simple Circuit Diagram, op-amp differential amplifier circuit using the LM 107 from National Semiconductor Corporation, p. 1-3, (http://www.simplecircuitdiagram.com/2010/04/04/op-amp-circuit-difference-amplifier/).*

* cited by examiner

*Primary Examiner* — Thomas Valone
(74) *Attorney, Agent, or Firm* — Muncy, Geissler, Olds & Lowe, PLLC

(57) ABSTRACT

A circuit testing apparatus for testing a device under test is disclosed. The device under test includes a first terminal end and second terminal end for generating a first output signal and a second output signal, respectively. The circuit testing apparatus determines whether the device under test has passed the test according to the first and second output signals.

7 Claims, 3 Drawing Sheets

CIRCUIT TEST APPARATUS

CROSS REFERENCE TO RELATED APPLICATIONS

This Application claims priority of Taiwan Patent Application No. 97210244, filed on Jun. 10, 2008, the entirety of which is incorporated by reference herein.

BACKGROUND OF THE INVENTION

1. Field of the Invention

The invention relates in general to a circuit test apparatus and in particular to a circuit test apparatus having dynamic output for device under test (DUT).

2. Description of the Related Art

With scientific and technological progress, integrated circuits (ICs) have become powerful and significant components which are applied in electronic devices. Conventional analog and digital ICs have been used for many years and more modern mixed-signal ICs capable of analog/digital signal processing are continually being developed. To ensure quality and functionality of the ICs, each are tested and verified before shipping.

FIG. 1 is a perspective diagram of a conventional mixed-signal tester 10 receiving dynamic bridge outputs from a device under test (DUT) 12, such as an IC disposed on a DUT board 14. As shown in FIG. 1, the DUT 12 receives a test signal ST from the mixed-signal tester 10 and generates two dynamic bridge output signals $V_{out+}$ and $V_{out-}$ at the terminal ends N1 and N2, correspondingly. The mixed-signal tester 10 receives and measures the dynamic bridge output signals $V_{out+}$ and $V_{out-}$, to determine whether the DUT 12 has passed the test. However the mixed-signal tester 10 is relatively expensive and time consuming, as it requires two signal measurements for the two dynamic bridge output signals $V_{out+}$ and $V_{out-}$ for testing.

BRIEF SUMMARY OF INVENTION

The invention provides a circuit testing apparatus for testing a device under test, wherein the device under test comprises a first terminal end and second terminal end for generating a first output signal and a second output signal, respectively. The circuit testing apparatus determines whether the device under test has passed the test according to the first and second output signals.

An embodiment of the circuit test apparatus comprises a precision measure unit (PMU), a processing module, a computing module, and a micro processor. The PMU is connected to the DUT, wherein the PMU transmits a test signal to the DUT and receives a result signal corresponding to the test signal. The processing module is connected to the first and second terminal ends of the DUT, wherein the processing module receives the first and second output signals from the DUT and accordingly produces a processing signal. The computing module is connected to the processing module and the PMU, wherein the computing module receives and computes the processing signal and accordingly produces the result signal. The micro processor connects to the PMU and determines whether the DUT has passed the test according to the result signal.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
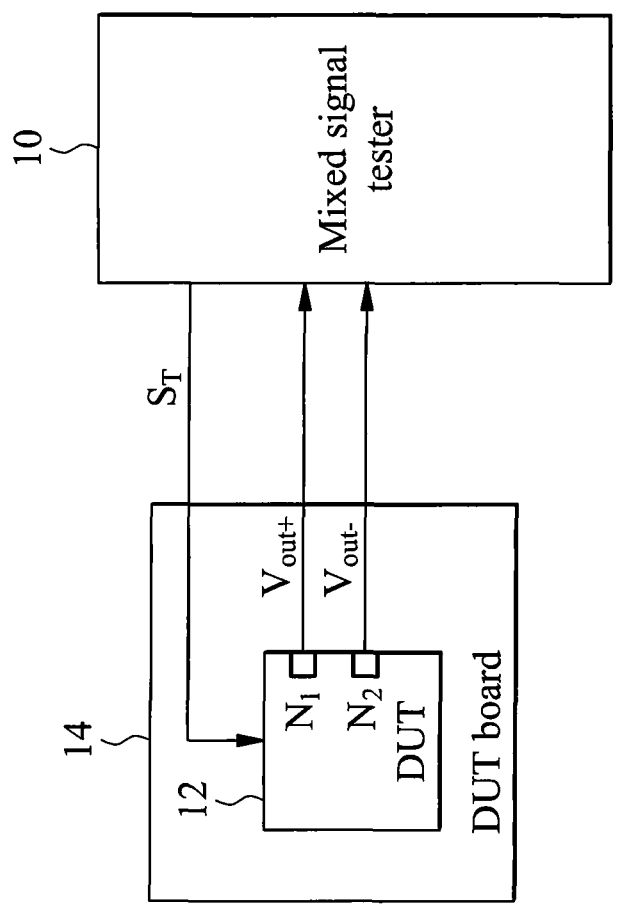
FIG. 1 is a perspective diagram of a conventional mixed-signal tester receiving dynamic bridge outputs from a device under test.
Figure 2:
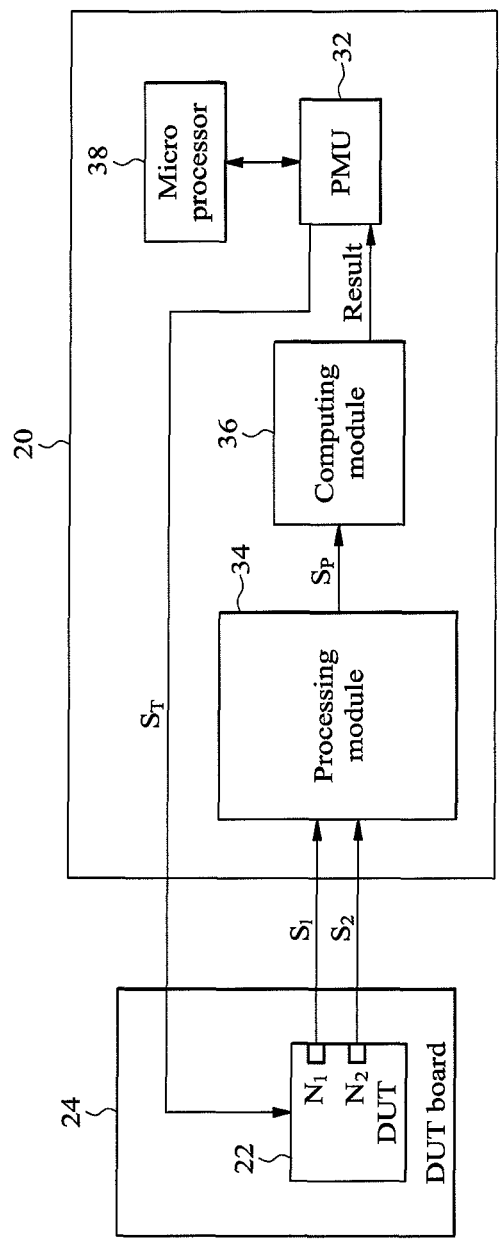
FIG. 2 is a perspective diagram of a circuit test apparatus according to an embodiment of the invention.

FIG. 2 is a perspective diagram of a circuit test apparatus 20 for testing a device under test (DUT) 22 on a DUT board 24. The DUT 22, such as an IC, comprises a first terminal end $N_1$ and a second terminal end $N_2$ for generating a first output signal $S_1$ and a second output signal $S_2$, respectively. The circuit test apparatus 20 can determine whether the DUT 22 has passed the functional test by receiving and analyzing the first and second output signals S1 and S2.

As shown in FIG. 2, the circuit test apparatus 20 primarily comprises a Precision Measurement Unit (PMU) 32, a processing module 34, a computing module 36, and a micro processor 38. The PMU 32 transmits a test signal $S_T$ to the DUT 22 and receives a result signal from the computing module 36, corresponding to the test signal $S_T$. The DUT 22 produces the first and second output signals $S_1$ and $S_2$ at the first and second terminal ends $N_1$ and $N_2$ according to the test signal $S_T$. The processing module 34 receives the first and second output signals $S_1$ and $S_2$ and produces a processing signal $S_P$. The computing module 36 receives and computes the processing signal $S_P$, so as to produce the result signal. The micro processor 38 is connected to the PMU 32 to determine whether the DUT 22 has passed the circuit test according to the result signal.

In this embodiment, the processing module 34 transforms the two double-ended AC mode output signals $S_1$ and $S_2$, into a single-ended AC mode processing signal 1 Sp. Specifically, the processing module 34 may comprise a differential amplifier circuit amplifying the difference between the signals $S_1$ and $S_2$ and accordingly generating the processing signal Sp.

Figure 3:
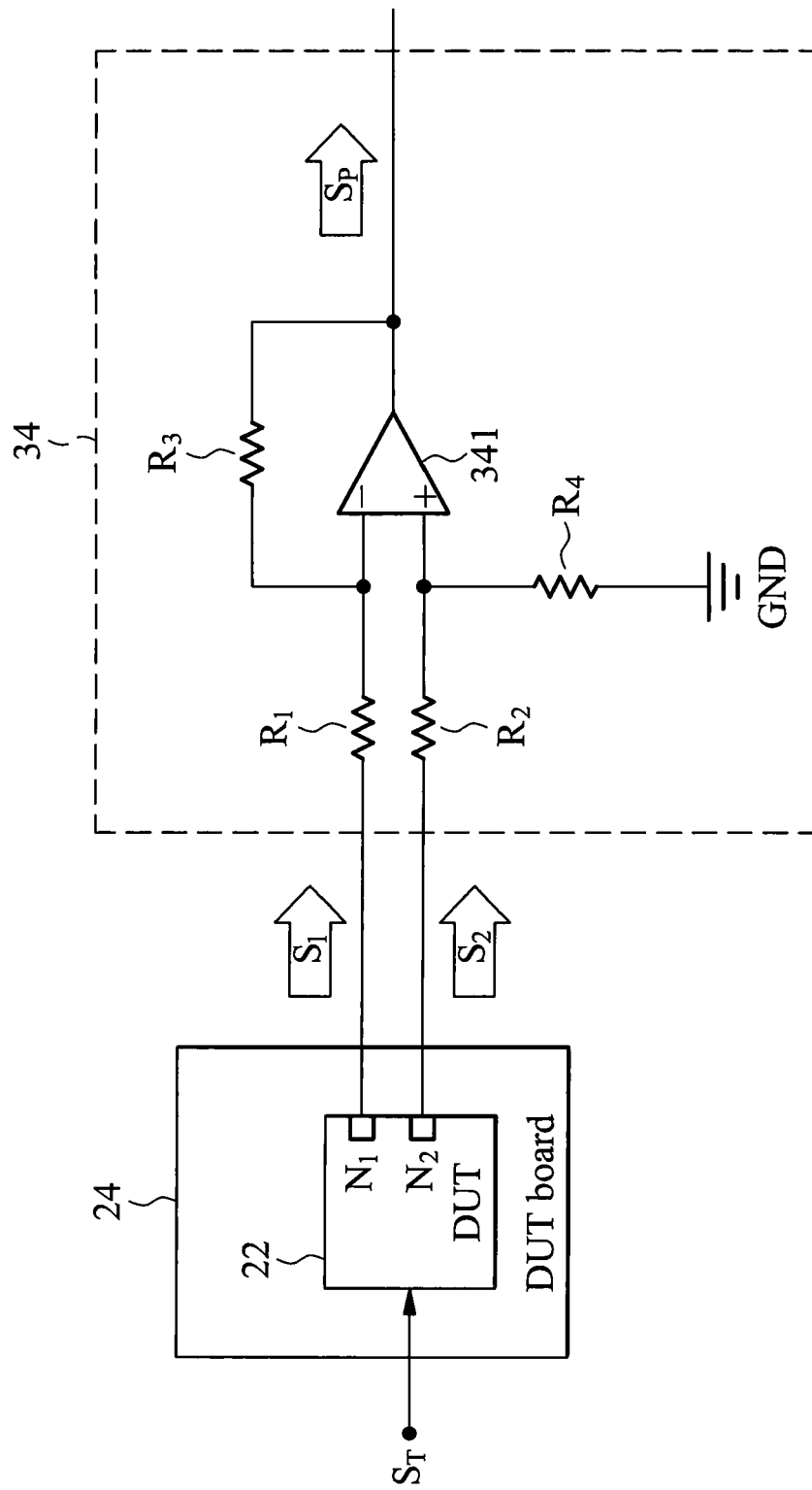
FIG. 3 is a perspective diagram of a processing module of a circuit test apparatus according to an embodiment of the invention.

FIG. 3 is a perspective diagram of the processing module 34 in FIG. 2 according to an embodiment of the invention. As shown in FIGS. 2 and 3, the processing module 34 comprises an operational amplifier 341, a first resistor $R_1$, a second resistor $R_2$, a third resistor $R_3$, and a fourth resistor $R_4$. The operational amplifier 341 has an inverting input, a non-inverting input, and an output, wherein the inverting and non-inverting inputs connect to the first and second terminal ends $N_1$ and $N_2$, respectively. The operational amplifier 341 is used for amplifying the difference between the signals $S_1$ and $S_2$, so as to accordingly generate the processing signal Sp. In FIG. 3, the first resistor $R_1$ is connected between the first terminal end $N_1$ and the inverting input of the operational amplifier 341. The second resistor $R_2$ is connected between the second terminal end $N_2$ and the non-inverting input of the operational amplifier 341. The third resistor $R_3$ is connected between the inverting input and the output of the operational amplifier 341. The fourth resistor $R_4$ is connected between the ground (GND) and the non-inverting input of the operational amplifier 341.

Moreover, the circuit test apparatus 20 further comprises a register (not shown) and a display module (not shown). The register is coupled with the micro processor 38 for storage of test results data, and the display module correspondingly shows the test results. In some embodiments, the circuit test apparatus 20 may be a logic tester with the PMU 32 and the micro processor 38 disposed therein.

According to the embodiments of the invention, the processing module 34 of the circuit test apparatus 20 amplifies the difference between the dynamic bridge output signals $S_1$ and $S_2$ and produces the single processing signal Sp. The computing module 36, such as a Root-Mean-Square (RMS) to DC converter, converts the processing signal Sp (AC mode) into the result signal (DC mode). Hence, the micro processor 38 can easily determine whether the DUT 22 has passed the test by analyzing the result signal. When compared to conventional mixed-signal testers requiring multiple measurements for dynamic bridge outputs, the circuit test apparatus of the invention is a faster and more efficient IC tester.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A circuit test apparatus for testing a device under test (DUT),
    wherein the DUT comprises a first terminal end and a second terminal end to produce a first output signal and a second output signal, respectively, and the circuit test apparatus determines whether the DUT has passed the test according to the first and second output signals, comprising:
    a precision measure unit (PMU) connected to the DUT, wherein the PMU transmits a DC mode test signal to the DUT and receives a result signal corresponding to the test signal;
    a processing module, connected to the first and second terminal ends of the DUT, wherein the processing module comprises a differential amplifier circuit amplifying the difference between the first and second output signals and accordingly generating a single-ended AC mode processing signal;
    a computing module, connected to the processing module and the PMU, wherein the computing module comprises an RMS to DC converter converting the single-ended AC mode processing signal into the DC mode result signal, wherein the computing module transmits the DC mode result signal through its output end to the PMU; and
    a micro processor, connected to the PMU and determining whether the DUT has passed the test according to the result signal.

2. The circuit test apparatus as claimed in claim 1, wherein the processing module comprises:
    an operational amplifier, comprising an inverting input, a non-inverting input, and an output, wherein the inverting and the non-inverting inputs respectively connect to the first and second terminal ends, to amplify the difference between the first and second output signals and accordingly generate the processing signal;
    a first resistor, connected between the first terminal end and the inverting input of the operational amplifier;
    a second resistor, connected between the second terminal end and the non-inverting input of the operational amplifier;
    a third resistor, connected between the inverting input and the output of the operational amplifier; and
    a fourth resistor, connected between a ground and the non-inverting input of the operational amplifier.

3. The circuit test apparatus as claimed in claim 1, wherein the circuit test apparatus is a logic tester.

4. The circuit test apparatus as claimed in claim 1, wherein the DUT is an IC.

5. The circuit test apparatus as claimed in claim 1, wherein the PMU and the micro processor are disposed in the circuit test apparatus.

6. The circuit test apparatus as claimed in claim 1, further comprising a register coupled with the micro processor for storage of test result data.

7. The circuit test apparatus as claimed in claim 1, further comprising a display module for showing a test result of the DUT.

* * * * *